United States Patent
Woo et al.

(10) Patent No.: US 7,280,077 B2
(45) Date of Patent: Oct. 9, 2007

(54) SYSTEM AND METHOD FOR MEASURING RADIATION CHARACTERISTIC OF ANTENNA

(76) Inventors: Jong-Myung Woo, 108-201, Hanvit Apt., Eoeun-dong, Yuseong-ku, 305-755, Daejeon-city (KR); Jong-Lae Kim, 220, Gung-dong, Yuseong-gu, 305-764, Daejeon-city (KR)

( * ) Notice: Subject to any disclaimer, the term of this patent is extended or adjusted under 35 U.S.C. 154(b) by 228 days.

(21) Appl. No.: 10/540,333

(22) PCT Filed: Dec. 19, 2003

(86) PCT No.: PCT/KR03/02788

§ 371 (c)(1), (2), (4) Date: Aug. 19, 2005

(87) PCT Pub. No.: WO2004/057349

PCT Pub. Date: Jul. 8, 2004

(65) Prior Publication Data

US 2006/0057985 A1  Mar. 16, 2006

(30) Foreign Application Priority Data

Dec. 20, 2002 (KR) .................. 10-2002-0081538

(51) Int. Cl.
*G01R 29/10* (2006.01)
(52) U.S. Cl. .................... 343/703; 343/895; 455/226.1
(58) Field of Classification Search ............. 343/703, 343/895; 455/67.11, 67.12, 67.14, 67.16, 455/226.1

See application file for complete search history.

(56) References Cited

U.S. PATENT DOCUMENTS

| 4,531,126 | A | 7/1985 | Sadones |
| 5,128,621 | A | 7/1992 | Berthaud et al. |
| 5,430,369 | A | 7/1995 | Bolomey et al. |
| 5,477,229 | A | 12/1995 | Caille et al. |
| 6,236,362 | B1 * | 5/2001 | Walley et al. ............. 342/360 |
| 7,035,594 | B2 * | 4/2006 | Wallace et al. .......... 455/67.12 |
| 7,170,457 | B2 * | 1/2007 | Tsai et al. ................. 343/703 |
| 2003/0173990 | A1 | 9/2003 | Nanbu |

OTHER PUBLICATIONS

International Search Report; International Application No. PCT/KR 03/02788-0; Date of Report: Feb. 23, 2004 by Austrian Patent Office, Dresdner Straβe, Vienna.

* cited by examiner

*Primary Examiner*—Tan Ho
(74) *Attorney, Agent, or Firm*—Andrew D. Fortney

(57) ABSTRACT

An antenna measurement system is provided to measure the radiation characteristic of a source antenna (2), and obtain more correct far-field range data within a short period of time. The antenna measurement system includes a tester body placed apart from the source antenna (2) with a predetermined distance. A plurality of measurement modules (20) are arranged at the tester body in a predetermined pattern. Each measurement module has an IC chip (22) for processing positional information and measured values to generate relevant signals, and a tester antenna for receiving and transmitting the signals from the IC chip (22). Upon receipt of frequency signals from the source antenna (2), the tester antenna (24) generates induced power for driving the IC chip (22), and transmits the measured values for the frequency signals to the IC chip (22). A measurement controller (30) receives the signals from the tester antenna (24), and data-processes the positional information and the measured values of the respective measurement modules (20).

12 Claims, 18 Drawing Sheets

SYSTEM AND METHOD FOR MEASURING RADIATION CHARACTERISTIC OF ANTENNA

This application is a 371 of PCT/KR03/02788 filed on Dec. 19, 2003.

BACKGROUND OF THE INVENTION (a) Field of the Invention

The present invention relates to a system and a method for measuring the radiation characteristic of an antenna, and more particularly, to an antenna measurement system and an antenna measurement method which speedily measure the radiation characteristic of a source antenna using micro-scaled test antennas and IC chips.

(b) Description of the Related Art

Generally, among the antenna ranges which are used to measure the radiation characteristic (the phase, or the intensity or amplitude) of the antenna, are there a far-field range where the measurement is made while the source antenna is placed far from the tester or receiver antenna, a near-field range where the measurement is made by using the source antenna as a transmitter and taking samples near to source antenna with a probe per a predetermined distance, and a compact range where the measurement is made while the source antenna is placed near to a reflector antenna being the tester antenna.

The far-field range is further classified into an elevated range where the measurement is made while the source antenna and the tester antenna are installed at a tower, a building or the top of a hill, a slant range where the measurement is made while one of the source and the tester antennas is placed at high position and the other on the ground, and an anechoic chamber where the measurement is made in a room having a wall with absorbents for removing the possible reflection. The elevated range and the slant range involve lower cost for the installation and measurement of the relevant elements, but practically require very wide area and high tower, with the disadvantage of being much influenced by the external weather. The anechoic chamber involves the indoor measurement, and is not influenced by the external weather, with the disadvantage in that much cost is needed to make a large laboratory (for example, making it with a vertical length of 10 m, a horizontal length of 10 m and a height of 5 m) with absorbents.

The far-field distance $r_{ff}$ between the source antenna and the tester antenna is given by $r_{ff}=2D^2/\lambda$ (where D indicates the inter-distance of the source antenna, and $\lambda$ indicates the operation frequency). As illustrated with the 70 m reflector antenna operated at 2.3 GHz, the far-field distance $r_{ff}$ is determined to be 75 km. Accordingly, with the case of the elevated range or the slant range, the distance between the source and the tester antennas becomes enlarged. As various objects such as trees, forests, hills, rivers and buildings are existent between the source antenna and the tester antenna, it is very difficult to make the correct measurement, and to quickly cope with the variable measurement situations. Consequently, the measurement values are largely differentiated due to the difference in the temperature, and the weather. Moreover, with the case of the far-field range, the source antenna is exposed to the outside to obtain the correct measured values, and hence, it becomes difficult in the radar or military antennas to make the desired measurement while keeping a secret.

The compact range is desirably installed within the relatively small space, but it undesirably requires a large-scaled reflector.

With the compact range, the measurement may be made in a very small space provided that the inter-distance of minimally 1 wavelength is made to the source antenna. However, as the probe should precisely move in the X and Y axial directions to correctly figure a predetermined plane (the plane perpendicular to the central axis of the source antenna) within the short distance, much time and cost are consumed to make the equipment for moving the probe (the tester antenna), and to make the desired measurement.

The anechoic chamber also involves the same problem as with the near-field range in that the measurement is made using a probe.

That is, with the case of the near-field range and the anechoic chamber, as the data measured at the probe are all transformed into far-field range data, the correct data can be obtained only when the probe moves very precisely. The precision in the movement of the probe is several micrometers to several tens micrometers. As the carrier for moving the probe very precisely is made with a high cost of up to hundreds of millions, it is practically difficult with the small-scale companies to make measurement experiments related to the development of antennas in a sufficient manner.

As the measurement is made while moving the probe in a slight manner, several hours are consumed even to make the measurement once, and this means that considerable time is wholly needed to complete the required measurements. Furthermore, with the high possibility of making errors in the measuring due to the variable environmental conditions, it becomes impossible to make the total inspection with respect to the produced antennas, and only the deficient sampling test can be made.

In order to obtain more correct far-field range data, it is required to enlarge the mobile range (the plane area) of the probe, but such an enlargement is practically limited due to the carrier for moving the probe.

Furthermore, the carrier for moving the probe is liable to generate electromagnetic waves, which are applied to the measured values as noises.

Furthermore, with the case of the near-field range and the anechoic chamber, as the measurement is made only to the front side of the source antenna, it is impossible to make correct expressions for the back lobe. In order to correctly express the back lobe, it is necessary to directionally reverse the source antenna and make the measurement again, and this involves the long measurement time increased by two times.

SUMMARY OF THE INVENTION

It is an object of the present invention to provide an antenna measurement system which can quickly and precisely measure the radiation characteristic of a source antenna (the phase, or the intensity or amplitude) using micro tester antennas and IC chips, thereby obtaining correct far-field range data.

It is another object of the present invention to provide an antenna measurement method which measures the radiation characteristic of a source antenna (the phase, or the intensity or amplitude) by arranging a plurality of measurement modules at a plane or sphere-shaped tester body each with a micro tester antenna and an IC chip, thereby obtaining correct far-field range data within a short period of time.

According to one aspect of the present invention, the antenna measurement system includes a tester body placed apart from the source antenna with a predetermined distance. A plurality of measurement modules are arranged at the tester body in a predetermined pattern. Each measurement module has an IC chip for processing positional information and measured values to generate relevant signals, and a tester antenna for receiving and transmitting the signals from the IC chip. Upon receipt of frequency signals from the source antenna, the tester antenna generates induced power for driving the IC chip, and transmits the measured values for the frequency signals to the IC chip. A measurement controller receives the signals from the tester antenna, and processes the positional information and the measured values of the respective measurement modules.

According to another aspect of the present invention, in a method of measuring the radiation characteristic of a source antenna, a plurality of measurement modules are arranged at a tester body in a predetermined pattern. Each module has an IC chip for processing positional information and measured values to generate signals, and a tester antenna for receiving and transmitting the signals from the IC chip. Upon receipt of frequency signals from the source antenna, the tester antenna generates induced power for driving the IC chip, and transmits the measured values for the frequency signals to the IC chip. The tester body is placed apart from the source antenna with a predetermined distance such that the tester body is perpendicular to the central axis of the source antenna. With the operating of the source antenna, the measurement controller is operated such that it receives and data-processes the positional information and the measured values from the tester antenna of each measurement module provided at the tester body.

According to still another aspect of the present invention, in a method of measuring the radiation characteristic of a source antenna, a plurality of measurement modules are arranged at a tester body in a predetermined pattern. Each module has an IC chip for processing positional information and measured values to generate signals, and a tester antenna for receiving and transmitting the signals from the IC chip. Upon receipt of frequency signals from the source antenna, the tester antenna generates induced power for driving the IC chip, and transmits the measured values for the frequency signals to the IC chip. The source antenna is placed within the tester body such that it is positioned at the center of the tester body. With the operating of the source antenna, the measurement controller is operated such that it receives and data-processes the positional information and the measured values from the tester antenna of each measurement module provided at the tester body.

The tester body is shaped with a plane, a circular arc, a sphere, a semi-sphere, a hexahedron, a hexahedron with no bottom side, a cone, a quadrangular pyramid, an octahedron, a dodecahedron, an icosahedron, or a horn.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein.

DETAILED DESCRIPTION OF THE PREFERRED EMBODIMENTS

Preferred embodiments of this invention will be explained with reference to the accompanying drawings.

Figure 1:
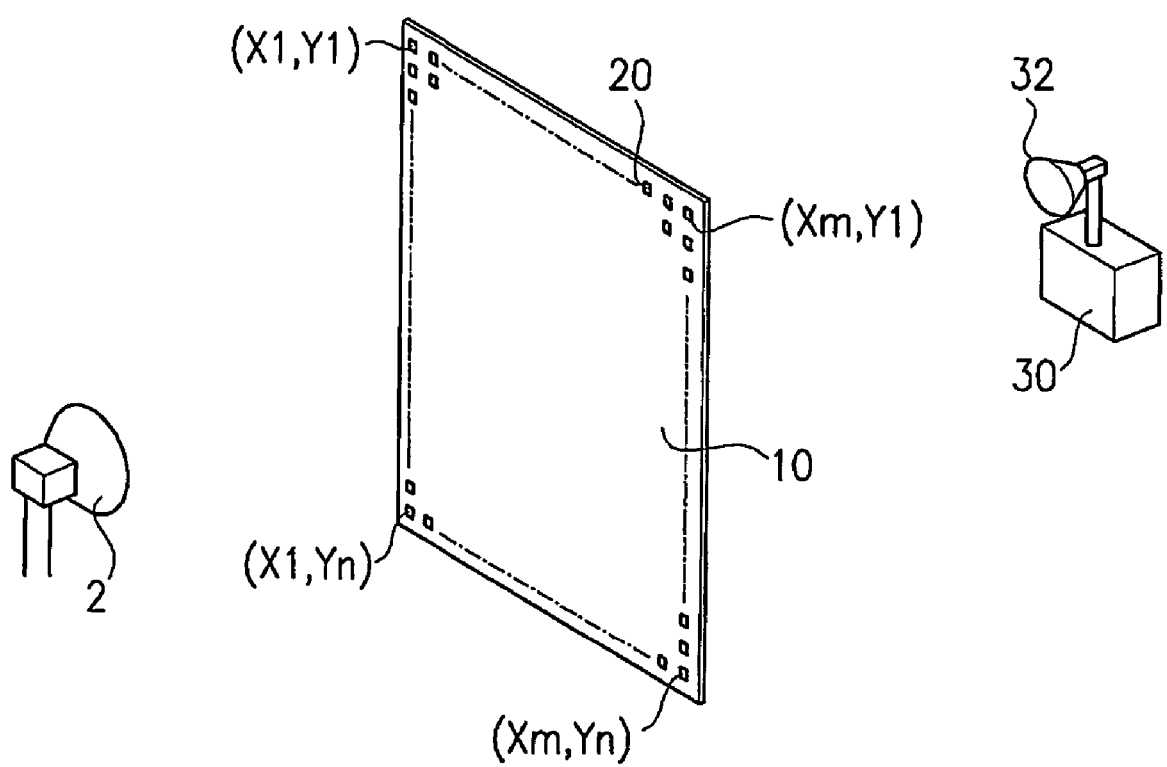
FIG. 1 is a schematic perspective view of an antenna measurement system according to a first embodiment of the present invention.
Figure 2:
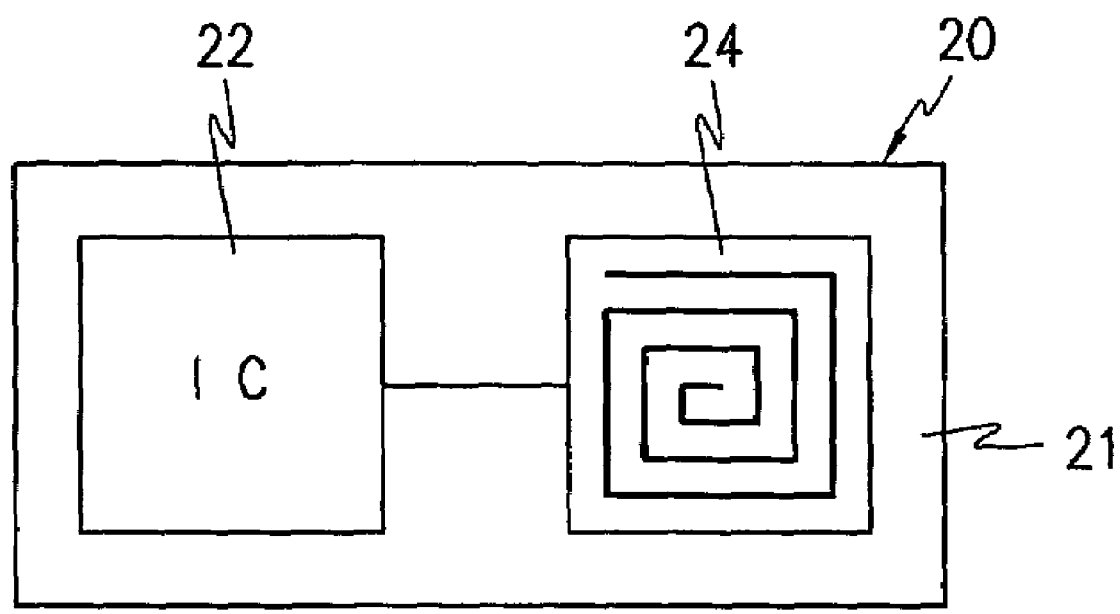
FIG. 2 is a plan view of a measurement module for the antenna measurement system shown in FIG. 1.

FIG. 1 is a schematic perspective view of an antenna measurement system according to a first embodiment of the present invention, and FIG. 2 is a plan view of a measurement module for the antenna measurement system shown in FIG. 1.

As shown in FIGS. 1 and 2, the antenna measurement system includes a tester body 10 placed distant from a source antenna 2 by a predetermined distance, a plurality of measurement modules 20 arranged at the tester body 10 in a predetermined pattern, and a measurement controller 30. Each measurement module 20 has an IC chip 22 for processing the positional information and the measured values to generate the relevant signals, and a tester antenna 24 for receiving and transmitting the signals from the IC chip 22. Upon receipt of the frequency signals from the source antenna 2, the tester antenna 24 generates induced power for driving the IC chip 22, and transmits the measured values for the frequency signals to the IC chip 22. The measurement controller 30 receives the signals from the tester antennas 24 of the measurement modules 20, and processes the positional information and the measured values of the respective measurement modules 20.

A receiver antenna 32 is installed at the measurement controller 30 to receive the signals from the tester antenna 24. With the measurement controller 30, a built-in software makes transformation of the measured values into far-field range data.

The tester body 10 is formed with a plane shape using a material little dispersed or reflected against the frequency signals from the source antenna 2.

As shown in FIG. 2, the measurement module 20 has a substrate 21 shaped with a rectangle, a circle or an oval having a length or a maximum diameter of 2-4 mm. The IC chip 22 and the antenna 24 are mounted on the substrate 21 by a surface mounting technique.

Alternatively, the IC chip 22 and/or the antenna 24 may be directly formed on the substrate 21 by printing or photolithography.

The IC chip stores the number peculiar to its location. It is possible to use a coordination value as the characteristic number for the location stored at the IC chip 22. For instance, with the measurement modules 20 arranged at the first row, the characteristic numbers are assigned thereto in the sequence of (X1, Y1), (X2, Y1), ..., (Xm, Y1). With the measurement modules 20 arranged at the last row, the characteristic numbers are assigned thereto in the sequence of (X1, Yn), (X2, Yn), ..., (Xm, Yn).

The IC chip 22 is programmed such that it transforms the values received at the tester antenna 24 related to the phase and the amplitude of the frequency signals or the dimension of the induced power into digital signals, and transmits them via the tester antenna 24.

As the IC chip 22 is currently made with several micrometers, it can be mounted on the substrate 21 with the micrometer-leveled size.

An amplification circuit is preferably installed at the IC chip 22 to amplify the micro-scaled frequency signal or induced power, and obtain precise measurement results.

The IC chip 22 is programmed such that it combines the measured value from the tester antenna 24 with the characteristic numbers in a predetermined sequence to generate a predetermined measurement signal, and transmits it via the tester antenna 24 together with the trigger signal.

The tester antenna 24 has a micro-scaled size such that it can be mounted on the substrate 21 with a very small size. A microstrip patch antenna or a dielectric chip antenna can be used as the micro tester antenna with a size of several millimeters.

Furthermore, the tester antenna 24 may have an ultra-micro size such that it can be mounted on the substrate 21 with a micrometer size.

As the size of the tester antenna 24 is increased, the measurement module 20 becomes enlarged. In this case, it is impossible to make the measurement per a minute distance, and accordingly, a correct measurement value cannot be obtained with the transformation of the measured values into far-field range data. Furthermore, in case the tester antenna 24 has a large size, it is likely that an error may be made in the measured values due to the impedance variation by the inter-coupling of the neighboring antennas. Therefore, in order to obtain the correct measured values, it is necessary to minimize the tester antenna 24.

However, with the conventional dipole antenna, microstrip patch antenna and dielectric chip antenna, it is impossible to make the antenna with a size of 2 mm or less.

In this respect, a new micro-scaled antenna structure is presented with the inventive system.

That is, the tester antenna 24 has wires spirally wound on two or more-leveled imagined planes, respectively. The wires formed at the imagined plane neighbors are connected to each other at their central ends or peripheral ends to form a single line.

Figure 3:
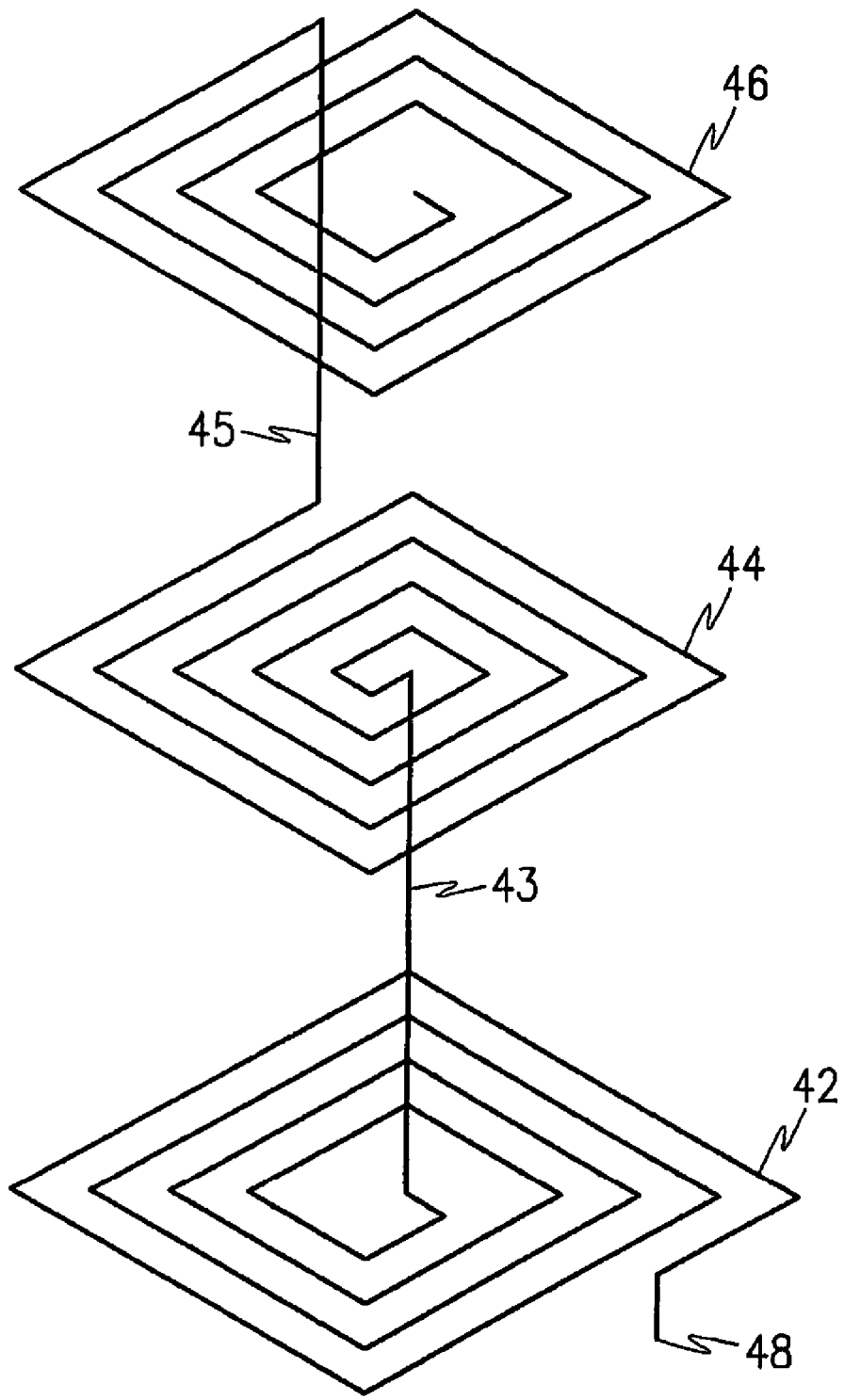
FIG. 3 schematically illustrates a tester antenna for the antenna measurement system shown in FIG. 1.

As shown in FIG. 3, the antenna 24 has wires 42, 44 and 46 spirally wound on first to third imagined planes. In order to form a single line, the wires 42 and 44 formed at the first and second imagined planes are connected to each other at their central ends using an interconnection line 43. The wires 44 and 46 formed at the second and third imagined planes are connected to each other at their peripheral ends using an interconnection line 45.

A feeder 48 is connected to the peripheral end of the wire 42 formed at the bottommost first imagined plane.

If the wires 42, 44 and 46 and the interconnection lines 43 and 45 are elongated by holding the peripheral end of the wire 46 and the feeder 48, the whole wire portions make formation of a single line.

The wires 42, 44 and 46 may be outlined with various shapes, such as a rectangle, a circle, an oval, a hexagon, or an octagon.

It is preferable to shorten the length of the interconnection lines 43 and 45 as much as possible.

When the length of the interconnection lines 43 and 45 becomes smaller, the distance between the neighboring wires 42, 44 and 45 is narrowed so that the inter-impedance thereof is maximized to thereby compensate for the increased capacitance.

Furthermore, it is preferable to form an insulating layer (not shown) between the wires 42, 44 and 46 to prevent the possible short-circuiting.

Figure 4:
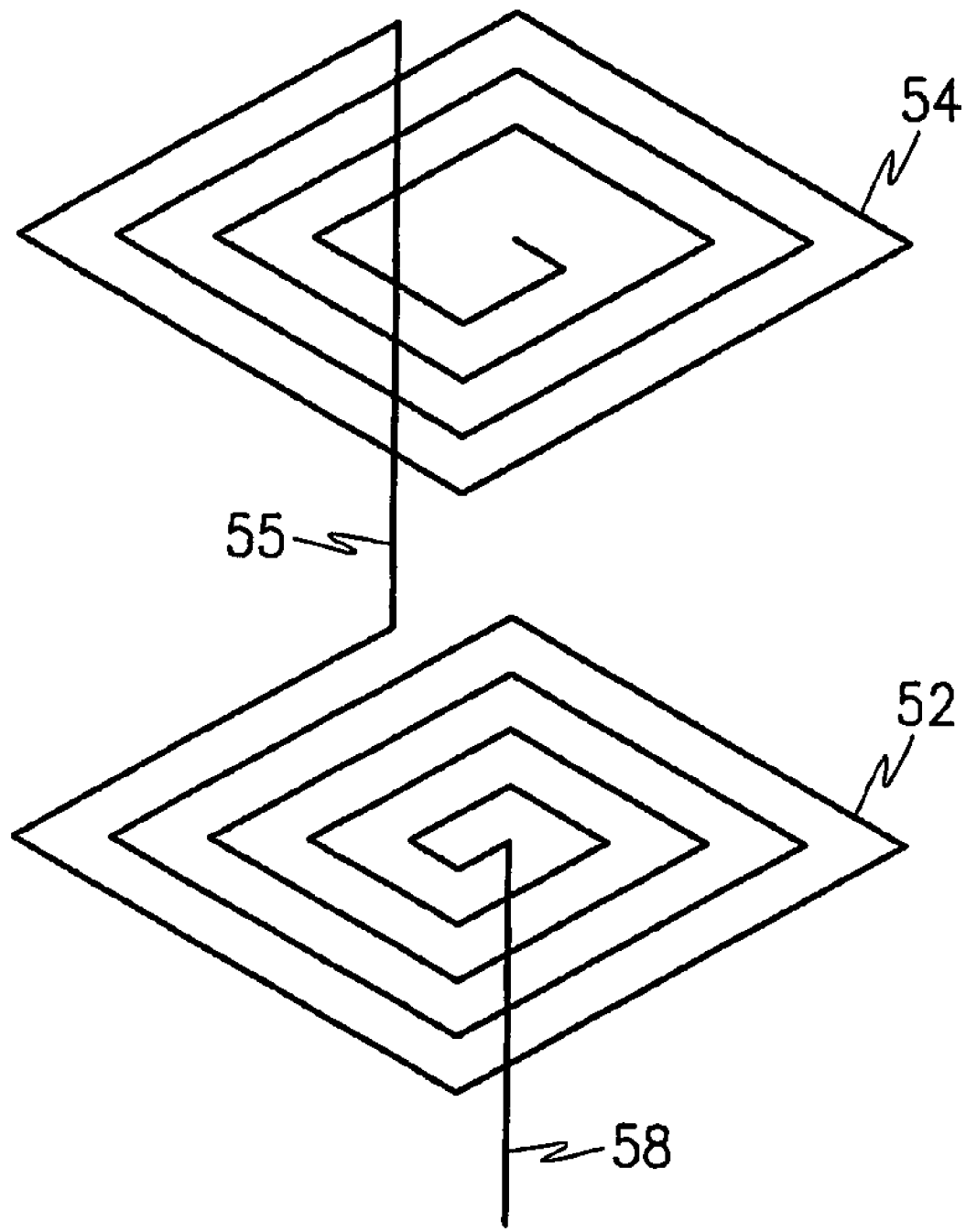
FIG. 4 schematically illustrates a first variation of the tester antenna shown in FIG. 3.

Alternatively, as shown in FIG. 4, the tester antenna 24 may have wires 52 and 54 spirally wound on the two-leveled imagined planes, respectively. The wires 52 and 54 are connected to each other at their peripheral ends using an interconnection line 55. A feeder 58 is connected to the central end of the wire 52 formed at the lower imagined plane.

Figure 9:
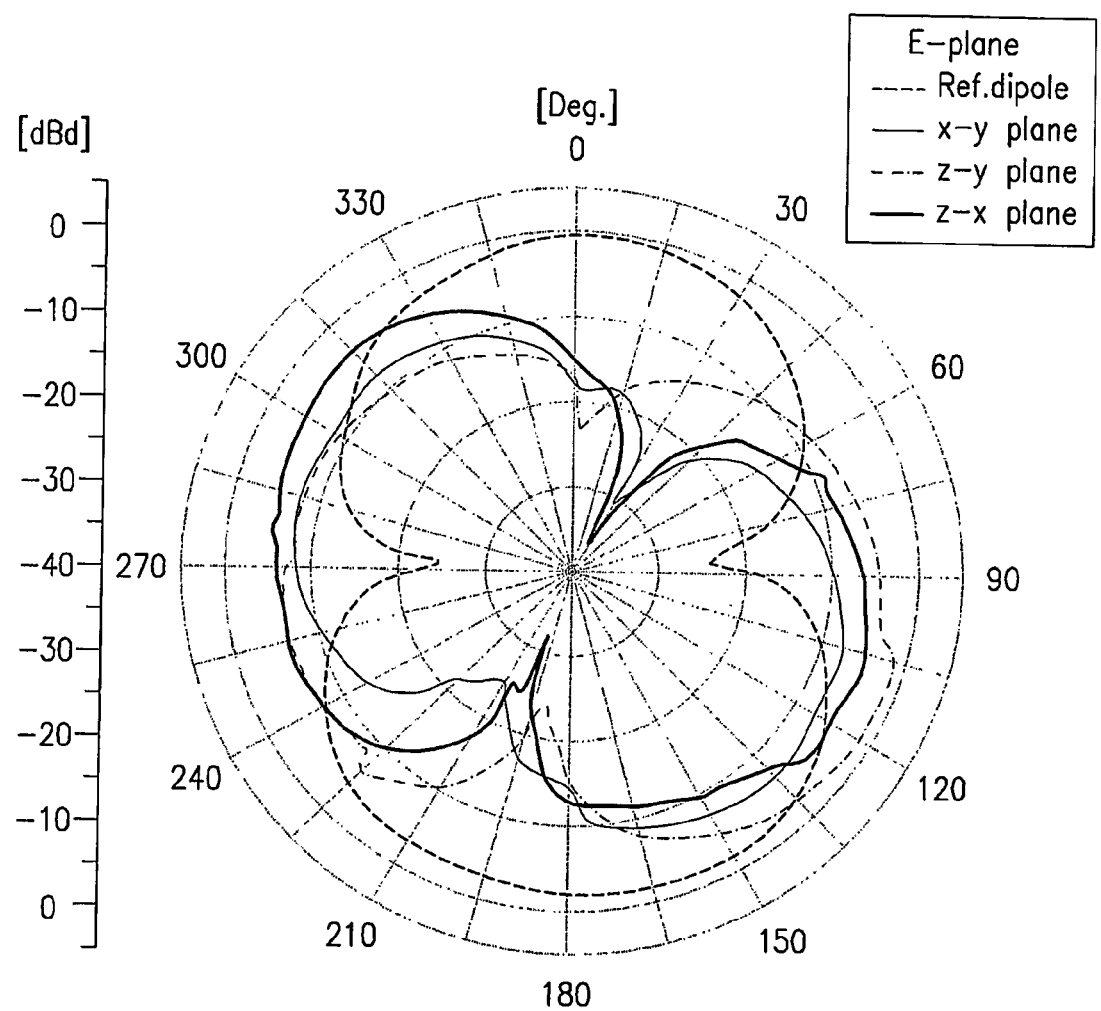
FIG. 9 is a graph illustrating the radiation pattern of the E-plane measured using the tester antenna shown in FIG. 4.
Figure 10:
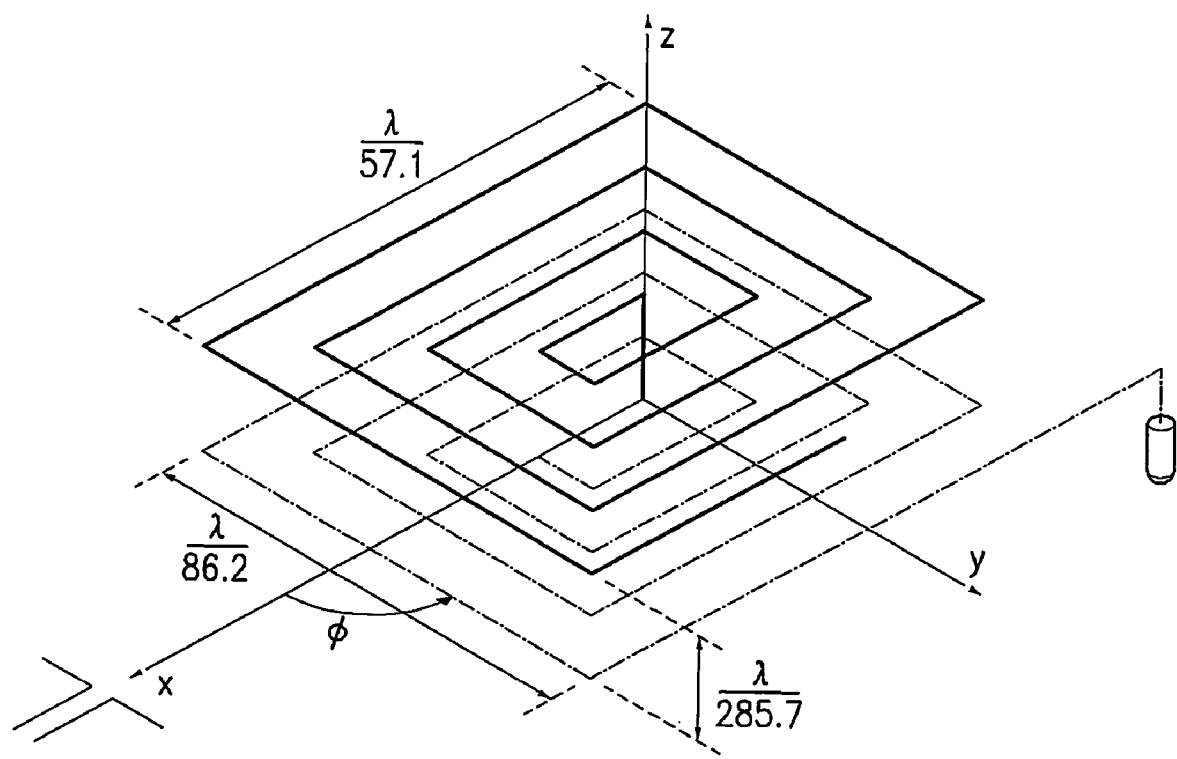
FIG. 10 illustrates the state of the tester antenna measuring the x-y plane in the radiation pattern shown in FIG. 9.
Figure 11:
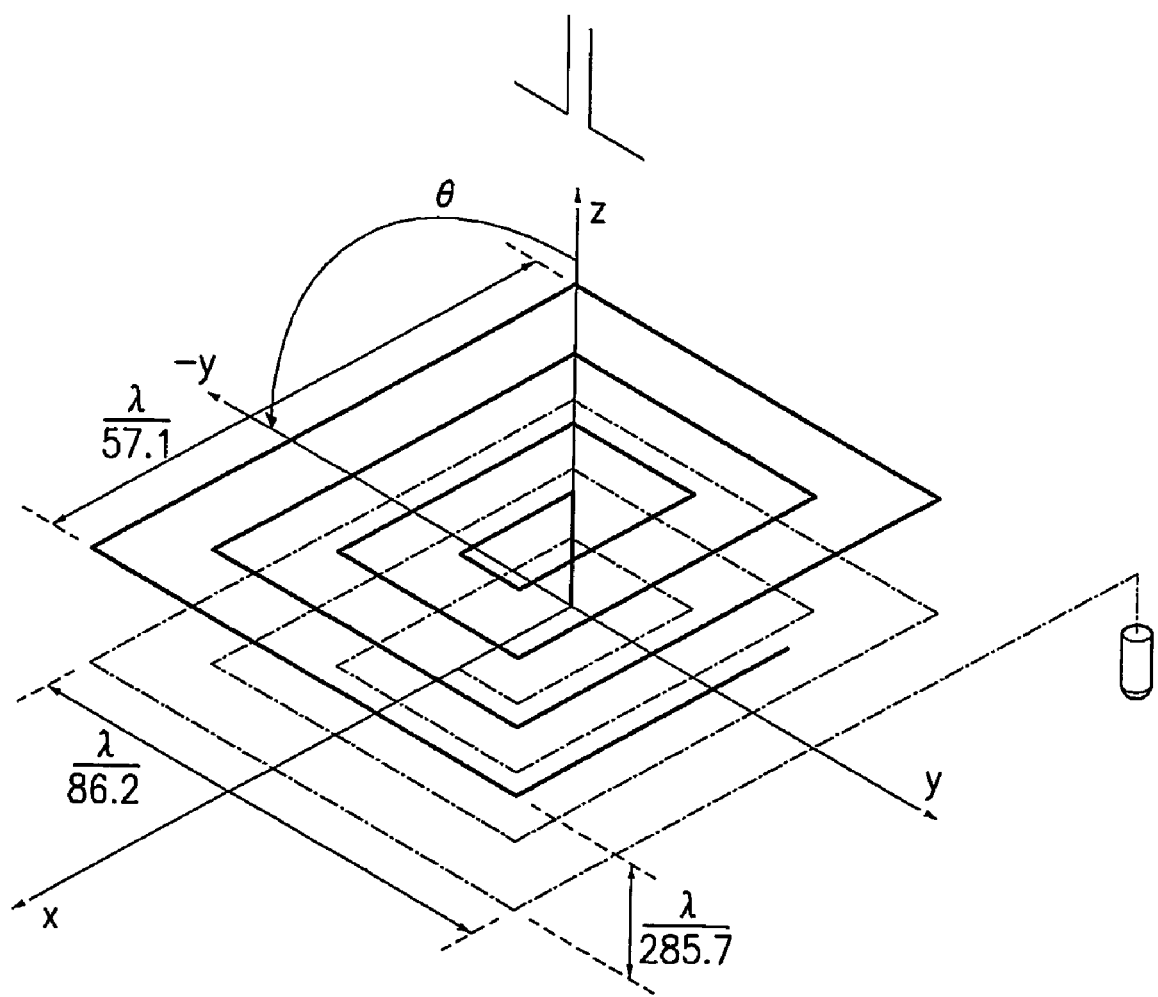
FIG. 11 illustrates the state of the tester antenna measuring the z-y plane in the radiation pattern shown in FIG. 9.
Figure 12:
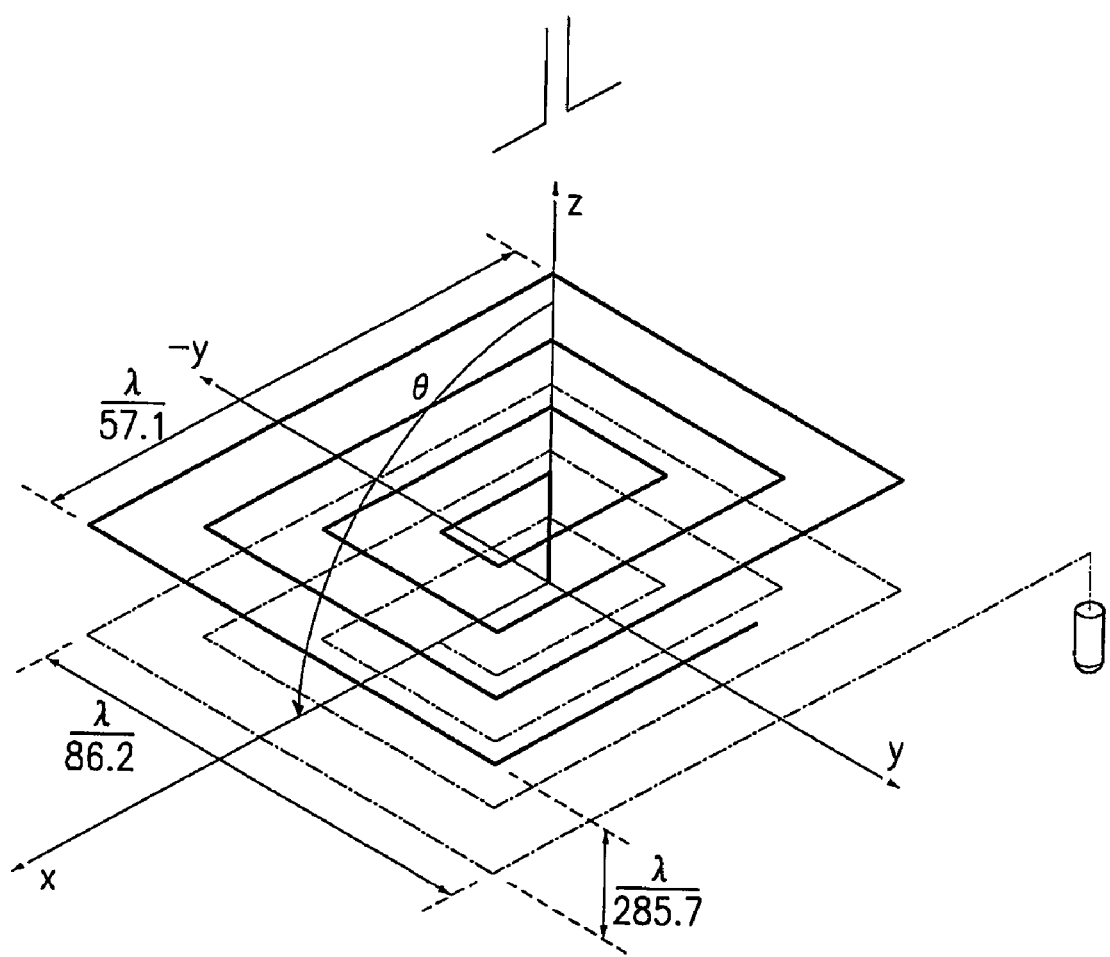
FIG. 12 illustrates the state of the tester antenna measuring the z-x plane in the radiation pattern shown in FIG. 9.
Figure 13:
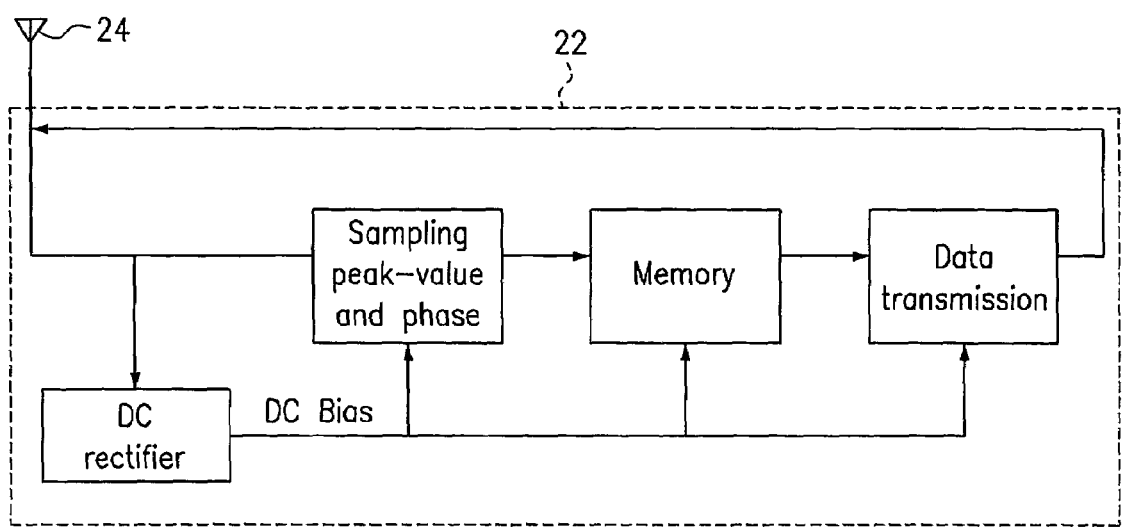
FIG. 13 is a block diagram illustrating the operation of the tester antenna and the IC chip.

FIG. 9 illustrates the radiation pattern of the E-plane measured at 390 MHz while the tester antennas 24 are arranged in various directions as illustrated in FIGS. 10 to 12.

The radiation pattern is measured by establishing the distance between the transmitter side of the tester antenna and the receiver side thereof to be 122 cm, and the heights thereof identically to be 204 cm. The tester antenna 24 is structured such that the horizontal length of the outermost spiral portion thereof is established to be $\lambda/86.2$ mm of the wavelength ($\lambda$), and the vertical length thereof to be $\lambda/57.1$ mm. The antenna portions are wound four times with the same distance, and the height of the two imagined planes is established to be $\lambda/285.7$ mm.

Compared to the conventional dipole antenna, the x-y plane of FIG. 9 was measured by installing the tester antenna 24 to be in the state illustrated in FIG. 10. The z-y plane was measured by installing the tester antenna 24 to be in the state illustrated in FIG. 11. The z-x plane was measured by installing the tester antenna 24 in the state illustrated in FIG. 12.

As shown in FIG. 9, the three cases all exhibited a radiation pattern similar to that of the dipole antenna.

Figure 5:
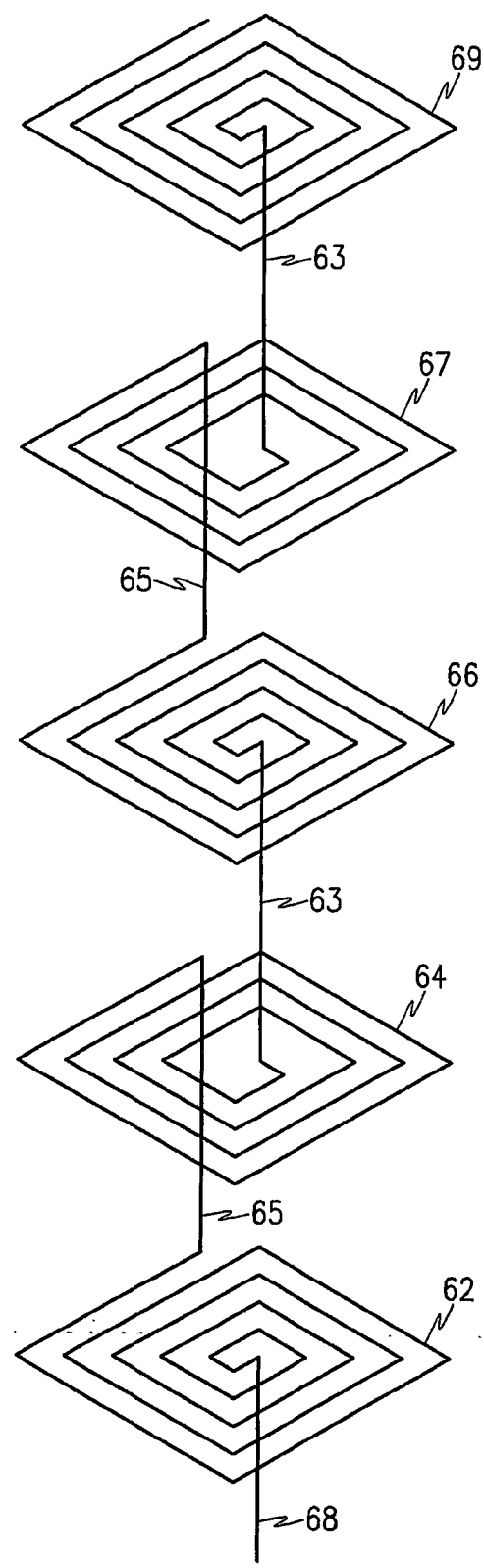
FIG. 5 schematically illustrates a second variation of the tester antenna shown in FIG. 3.

Furthermore, as shown in FIG. 5, the tester antenna 24 may have five wires 62, 64, 66, 67 and 69 spirally wound on the five-leveled imagined planes. The wires 62 and 64 formed at the first and second imagined plane neighbors as well as the wires 66 and 67 formed at the third and fourth imagined plane neighbors are connected to each other at their peripheral ends using interconnection lines 63. The wires 64 and 66 formed at the second and third imagined plane neighbors as well as the wires 67 and 69 formed at the fourth and fifth imagined plane neighbors are connected to each other at their central ends using interconnection lines 65. A feeder 68 is connected to the central end of the wire 62 formed at the bottommost imagined plane.

As described above, the tester antenna 24 is structured such that the wires formed at the imagined plane neighbors are connected to each other repeatedly at their central ends and at their peripheral ends in an alternate manner while wholly forming a single line.

Figure 6:
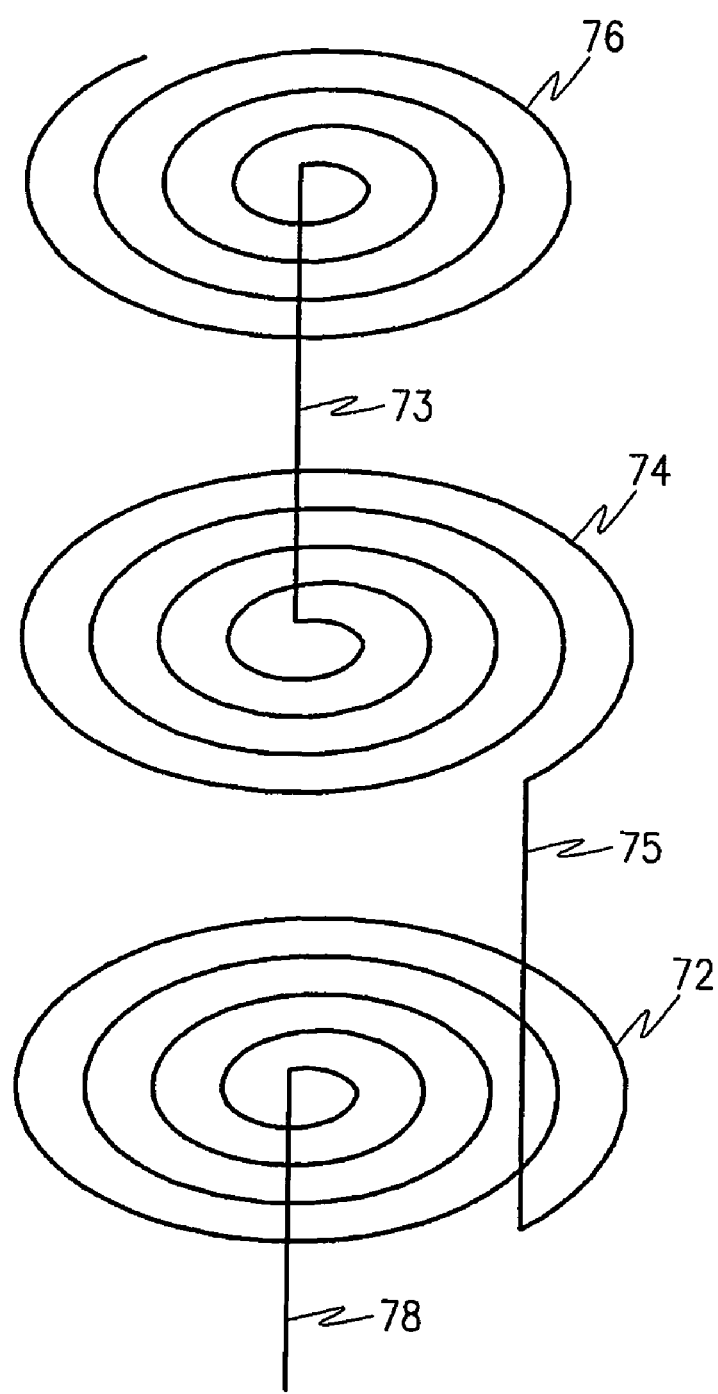
FIG. 6 schematically illustrates a third variation of the tester antenna shown in FIG. 3.

As shown in FIG. 6, the tester antenna 24 may be structured such that the wires 72, 74 and 76 formed at the imagined planes are spirally wound each in the shape of an oval, and connected to each other using interconnection lines 73 and 75 while forming a single line. A feeder 78 is connected to the bottommost wire 72.

Figure 7:
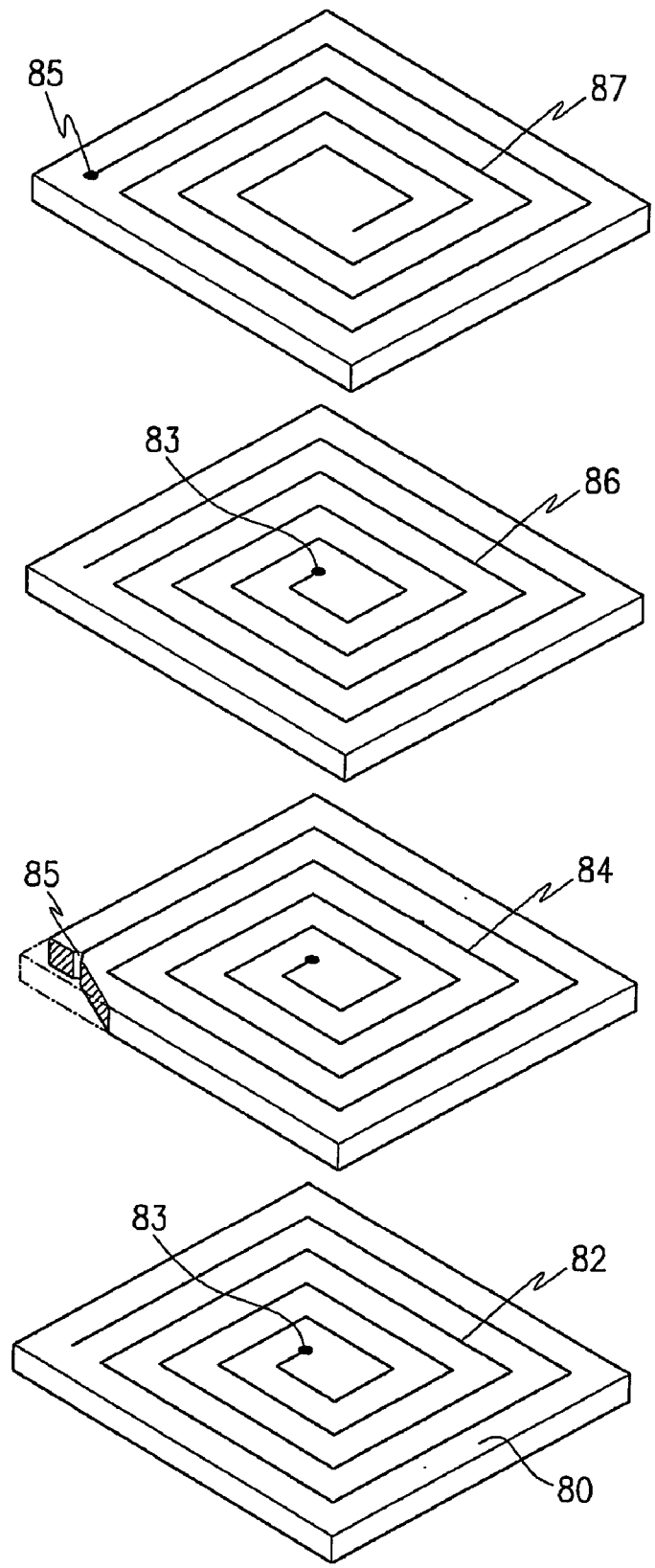
FIG. 7 schematically illustrates a fourth variation of the tester antenna shown in FIG. 3 in an exploded manner.
Figure 8:
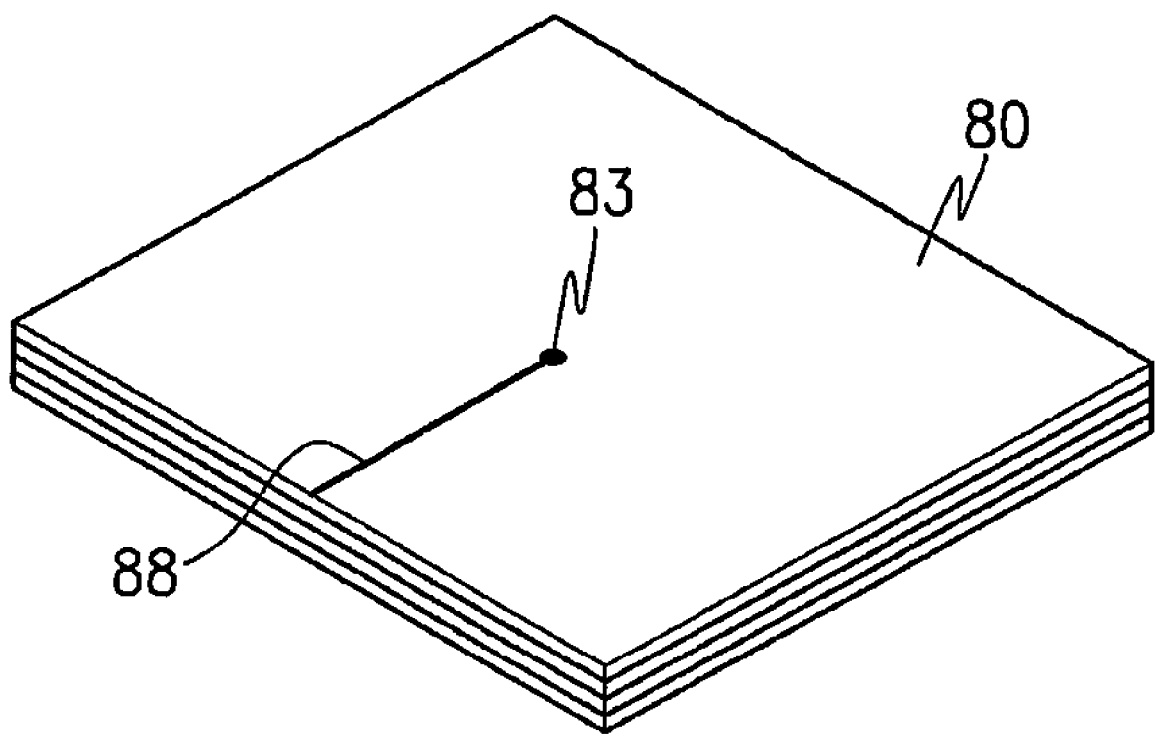
FIG. 8 illustrates the bottom side of the tester antenna shown in FIG. 7.

As shown in FIGS. 7 and 8, the antenna 24 may be structured such that four dielectric films 80 are placed at first to fourth imagined planes, and spiral wires 82, 84, 86 and 87 are printed on the one-sided surfaces thereof. Through holes 83 are formed at the first and third-leveled dielectric thin films 80 such that they are connected to the central ends of the wires 82 and 86. Through holes 85 are formed at the second and fourth-leveled dielectric thin films such that they are connected to the peripheral ends of the wires 84 and 87. The through holes 83 and 85 are filled with conductive powder, and the four dielectric thin films are closely adhered to each other to form a single chip. The chip is heated at a predetermined temperature, and the conductive powder in the through holes 83 and 85 are molten so that the wire neighbors are connected to each other to form a single line.

As described above, the dielectric thin film where the through hole is connected to the central end of the wire, and the dielectric thin film where the through hole is connected to the peripheral end of the wire are alternately deposited.

Furthermore, as shown in FIG. 8, a feeder 88 is formed at the bottom side of the bottommost dielectric thin film 80 such that it is connected to the through hole 83.

The spiral wires 82, 84, 86 and 87 and the feeder 88 are formed at the dielectric thin films 80 by a printing technique or a photolithography technique commonly used in the semiconductor manufacturing process.

When the tester antenna 24 is formed with the above structure, it is possible to make the tester antenna with a micrometer-scaled size such that it can be mounted on the substrate 21 having a size of several micrometers together with the IC chip 22.

A receiver antenna 32 is installed at the measurement controller 30 to receive the signals from the tester antenna 24. The measurement controller 30 transforms the signals received at the receiver antenna 32, and displays them by a monitor, or outputs them by a printer. It stores the positional information of the measurement modules 20 as well as the measured values.

The values measured at the tester antenna 24 and transmitted to the measurement controller 30 are the phase and the amplitude of the frequency signals from the source antenna 2.

A method of measuring the radiation characteristic of the source antenna 2 using the above-structured antenna measurement system will be explained with reference to FIGS. 1 to 13.

First, measurement modules 20 each with an IC chip 22 storing the positional information intrinsic thereto and a tester antenna 24 are mounted at the predetermined locations of a tester body 10.

When the tester body 10 is made, it is placed at the predetermined location (distant from the source antenna by 1 wavelength of the frequency therefrom), and the source antenna 2 is operated.

With the operation of the source antenna 2, predetermined frequency signals are generated, and transmitted in all directions. The tester antenna 24 of the measurement module 20 installed at the tester body 10 receives the frequency signals (the electromagnetic waves) from the source antenna 2, which partially generate induced power (using an RF-DC rectifier) to drive the IC chip 22.

The IC chip 22 uses the induced power from the tester antenna 24 without requiring a separate power supply. Therefore, when a large-sized tester body 10 is made, or even when a large number of measurement modules 20 are mounted on the tester body 10, the wire for the power supplying is unneeded, and the structure is simplified while ensuring the easy making thereof.

The IC chip 22 of the measurement module 20 samples the amplitude and the phase of the frequency and the dimension of the induced power from the tester antenna 24, and stores and modulates them (using PSK and/or FSK modulation or CDMA). The IC chip 22 transmits the positional information and the modulated signals via the tester antenna 24.

The measurement controller 30 receives the signals from the tester antenna 24 via the receiver antenna 32, and data-processes the positional information and the modulated signals of the respective measurement modules 20 to compute and store the data. The data are output by a display device or a printer.

The measurement controller 30 has a built-in software to transform the measured values from the measurement modules 20 into the data of the far-field range, and output them by a display device or a printer.

When the front of the source antenna 2 is measured and it is further intended to correctly measure the back lobe thereof, the measurement is made once more while the source antenna 2 is rotated by 180°, or the installation position of the tester body 10 is varied by 180° to that position symmetrical thereto. Even in this case, as the measurement time is extremely short, the time consumption is reduced significantly compared to the conventional case.

Figure 14:
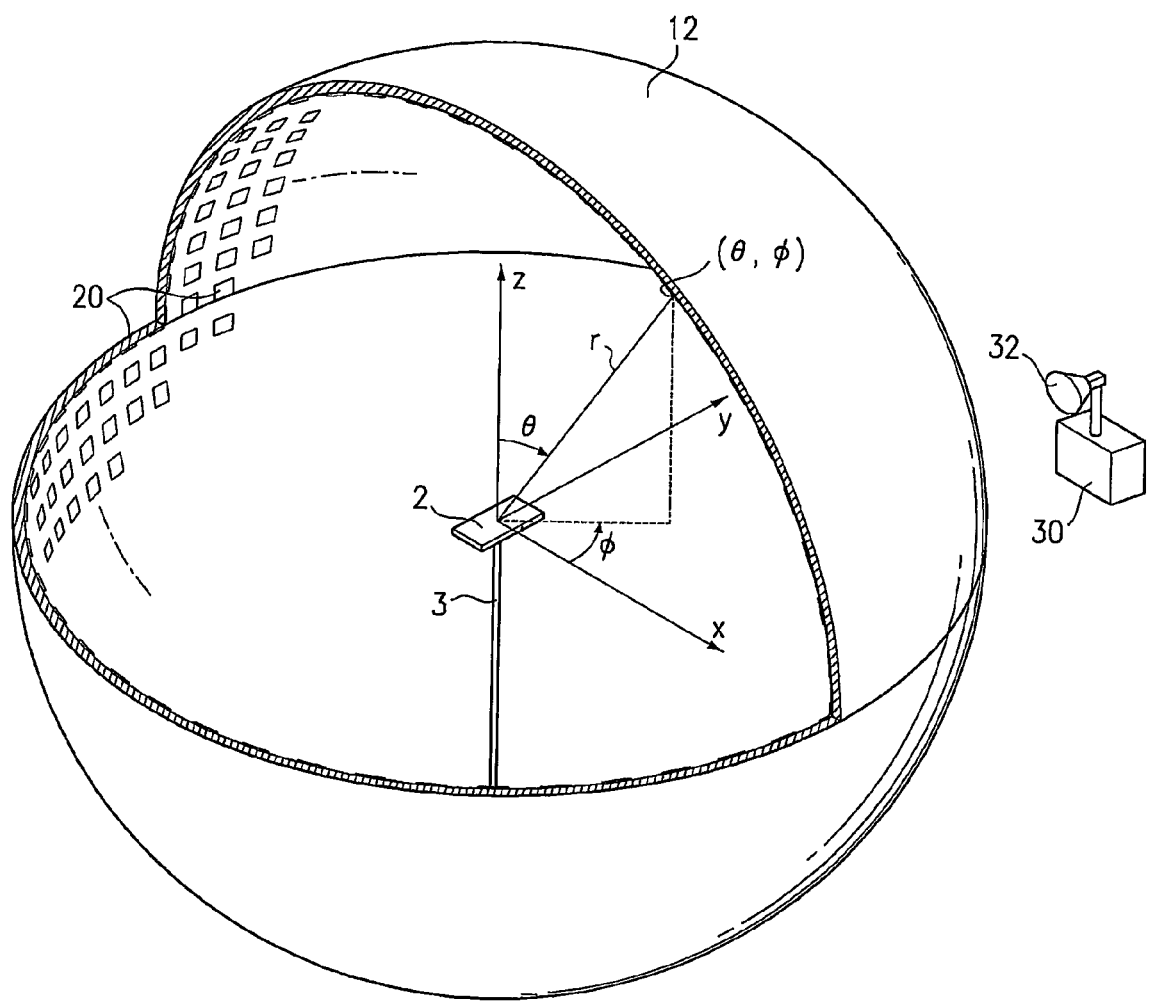
FIG. 14 is a partial sectional perspective view of an antenna measurement system according to a second embodiment of the present invention.

FIG. 14 illustrates an antenna measurement system according to a second embodiment of the present invention.

As shown in FIG. 14, the tester body 12 is shaped with a sphere, and the measurement modules 20 are arranged on the inner surface of the tester body 12 in a predetermined pattern.

It is preferable to store the number characteristic to the installation location of the respective measurement modules 20 at the IC chip 22 using the coordination value (θ, φ) with the angle (θ) to the z axis and the angle (φ) to the x axis.

In case the tester body 12 is formed with a spherical shape, it is bisected into upper and lower parts. With this structure, it is easy to install and replace the source antenna 2 within the tester body 12.

The source antenna 2 is fixed to a support 3 placed at the lower part of the tester body 12 such that it is positioned at the center of the spherical shaped structure. It is preferable to structure the source antenna 2 such that the height thereof can be varied in a controlled manner.

Other structural components of the antenna measurement system according to the second embodiment of the present invention are the same as those related to the first embodiment, and hence, detailed explanation thereof will be omitted.

When the tester body 12 is formed with a spherical shape, it is possible to correctly measure the all directional (360°) characteristic of the source antenna 2 only with the one-timed measurement.

The measurement module 20 installed at the tester body 12 is structured that the tester antenna 24 is positioned perpendicular to the radius (r) of the tester body 12 being the measurement distance, thereby being located vertical to the progressive direction of the electromagnetic wave.

In order to obtain more correct far-field range data, the tester body 12 is preferably structured such that the radius (r) thereof being the distance from the source antenna 2 to the measurement module 20 becomes enlarged as much as possible.

Figure 15:
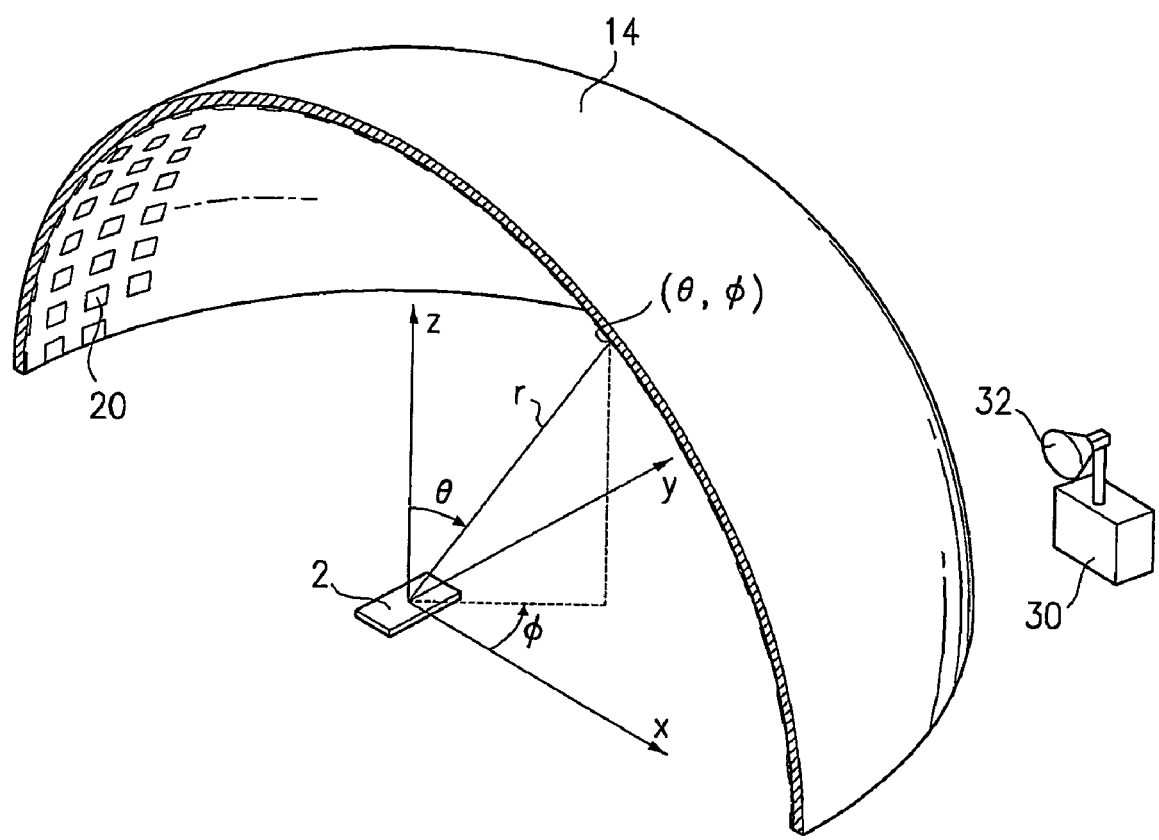
FIG. 15 is a partial sectional perspective view of an antenna measurement system according to a third embodiment of the present invention.

FIG. 15 illustrates an antenna measurement system according to a third embodiment of the present invention.

As shown in FIG. 15, the tester body 14 is formed with a semi-spherical shape, and the measurement modules 20 are arranged internal to the tester body 14 in a predetermined pattern.

The characteristic positional number of each measurement module 20 is input into the IC chip 22 using the coordination value (θ, ϕ) with the angle (θ) to the z axis and the angle (ϕ) to the x axis.

The structure of the tester body 14 according to the third embodiment of the present invention is the same as the upper part of the tester body 12 according to the second embodiment. In the case of the antennas installed on the ground, it is not needed to measure the characteristic thereof directed toward the ground, and hence, the structure according to the third embodiment is more effective than that according to the second embodiment.

Figure 16:
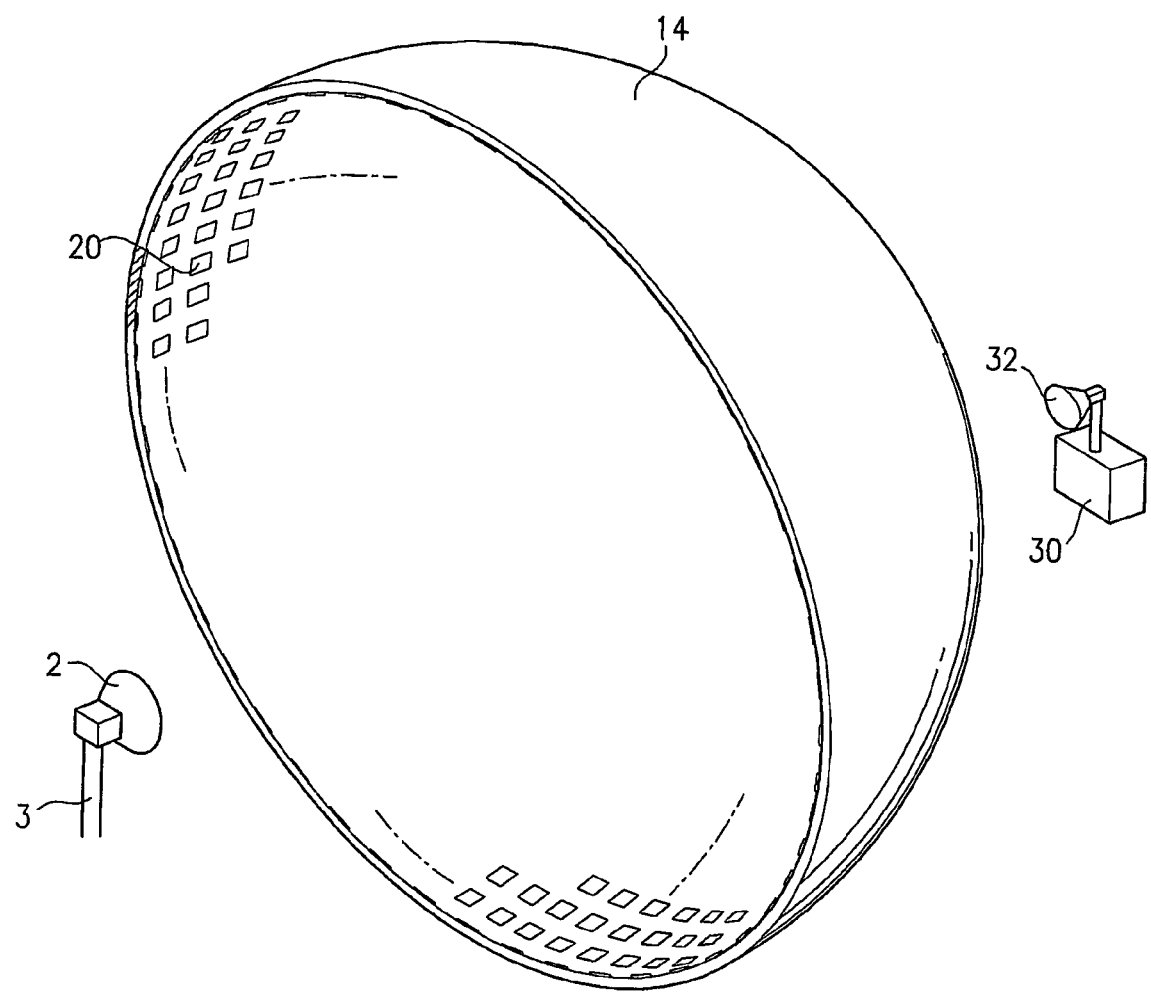
FIG. 16 illustrates the antenna measurement system shown in FIG. 15 where the tester body is in a standing state.

Furthermore, when the tester body 14 is formed with a semi-spherical shape, as shown in FIG. 16, it is possible that the tester body 14 is in a standing state as like with the structure related to the first embodiment, and the measurement is made while the source antenna 2 is placed on the extended line of the center of the tester body 14. In this case, it is like the structure in that the plane-shaped tester body 10 according to the first embodiment is replaced by the semi-spherical shaped tester body 14 according to the third embodiment.

Figure 17:
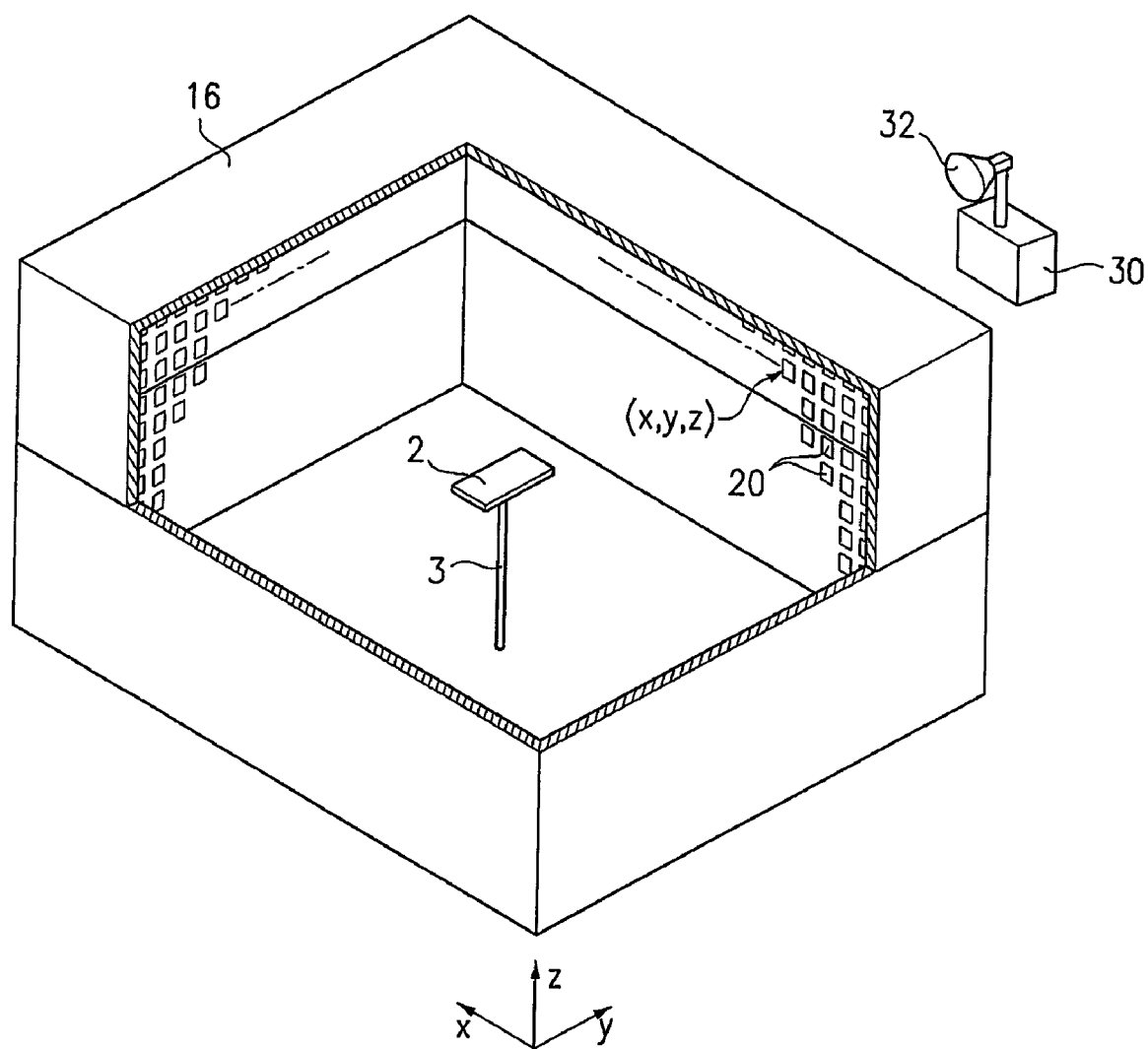
FIG. 17 is a partial sectional perspective view of an antenna measurement system according to a fourth embodiment of the present invention.

FIG. 17 illustrates an antenna measurement system according to a fourth embodiment of the present invention.

As shown in FIG. 17, the tester body is shaped with a hexahedron, and the measurement modules 20 are arranged at the inner surface of the tester body 16 in a predetermined pattern.

The characteristic positional number of each measurement module 20 is input into the IC chip 22 using the three dimensional coordination values (x, y, z).

With the hexahedron-shaped tester body 16, the manufacturing and the installation thereof can be easily made compared to the case where it is formed with the spherical shape.

The hexahedron-shaped tester body 16 is formed with a combinatory structure where it is bisected into upper and lower parts, which are combined with each other.

Figure 18:
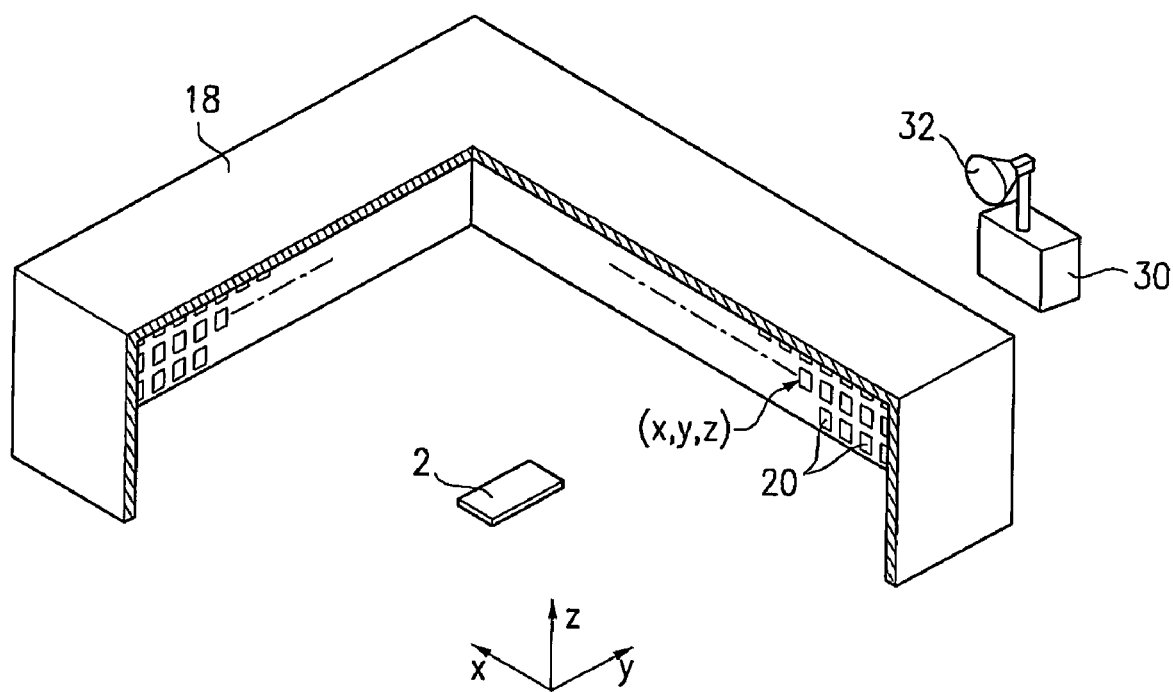
FIG. 18 is a partial sectional perspective view of an antenna measurement system according to a fifth embodiment of the present invention.

FIG. 18 illustrates an antenna measurement system according to a fifth embodiment of the present invention.

As shown in FIG. 18, the tester body 18 is shaped with a hexahedron where the bottom side is removed, and the measurement modules 20 are arranged internal to the tester body 18 in a predetermined pattern.

The structure of the tester body 18 according to the fifth embodiment is the same as the upper part of the tester body 16 according to the fourth embodiment. In the case of the antennas installed on the ground, it is not needed to measure the characteristic thereof directed toward the ground, and hence, the structure according to the fifth embodiment is more effective than that according to the fourth embodiment.

A method of measuring the radiation characteristic of the source antenna 2 using the antenna measurement systems according to the second to the fifth embodiments will be now explained.

Measurement modules 20 each with an IC chip 22 storing the characteristic positional information and a tester antenna 24 are arranged at a tester body 10 in a predetermined pattern.

When the making of the tester body 10 is completed, the source antenna 2 is operated while it is placed at the predetermined center location within the tester body 10.

As described above, when the source antenna 2 is operated, frequency signals are generated, and transmitted in all directions. The tester antenna 24 of the measurement module 20 internally placed on the tester body 10 receives the frequency signals (the electromagnetic waves) from the source antenna 2. Detailed explanation for the subsequent operating steps will be omitted as they are the same as those related to the first embodiment.

When the antenna characteristic of the source antenna 2 is measured in the above way, the all-directional characteristic thereof can be correctly known with the one-timed measurement. Furthermore, the measurement is effectively made within the indoor space, and the total inspection can be made at the antenna production site.

It is explained in relation to the second to fifth embodiments of the present invention that the tester body 12, 14, 16 or 8 is shaped with a sphere, a semi-sphere, a hexahedron, or a hexahedron with no bottom side. Alternatively, it may be shaped with an octahedron, a dodecahedron, an icosahedron, a cone, a quadrangular pyramid, or a horn.

It is further explained in relation to the first embodiment of the present invention that the tester body 10 is shaped with a plane. Alternatively, it may be shaped with a circular arc, a semicircle, a cone, a quadrangular pyramid, or a horn.

With the inventive system and method for measuring the radiation characteristic of an antenna, the source antenna is operated, and at the same time, the entire area of the tester body is measured. This makes it possible to conduct the desired measurement in real time.

With the inventive system and method for measuring the radiation characteristic of an antenna, it is possible to make a very small-scaled tester antenna. Furthermore, it is also possible to precisely install measurement modules at the tester body per a very small distance (2-3 μm). Consequently, the characteristic of the source antenna (the phase, and the intensity or amplitude of the frequency signal) can be simply and correctly measured in real time. The measurement is made without making any error due to the variation in the weather or the temperature.

With the inventive system and method for measuring the radiation characteristic of an antenna, the total facility cost is significantly reduced. Accordingly, it is possible to conduct measuring and testing the antenna radiation characteristic in small-scaled factories or institutes.

Furthermore, with the inventive system and method for measuring the radiation characteristic of an antenna, with some installation space for the plane-shaped or spherical-shaped tester body, it is possible to measure the characteristic of the source antenna. Therefore, it is possible to make larger the volume of the tester body or to make the arrangement distance between the measurement modules very small. In this way, it is possible to obtain more precise far-field range data. Particularly with the inventive system and method for measuring the radiation characteristic of an antenna, as it is possible to make the tester antenna in a very small scale, the impedance variation due to the inter-coupling of the neighboring antennas is extremely small even when the distance between the measurement modules is established to be several micrometers. Accordingly, even in such as case, the desired precise measurement values can be well obtained.

With the inventive system and method for measuring the radiation characteristic of an antenna, it is possible to measure the all directional antenna radiation characteristic within a very short period of time. Consequently, not the sampling test but the total inspection can be made in the process of manufacturing antennas, thereby enhancing the reliability of the resulting products significantly.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. An antenna measurement system for measuring the radiation characteristic of a source antenna, the antenna measurement system comprising:
   a tester body placed apart from the source antenna with a predetermined distance;
   a plurality of measurement modules arranged at the tester body in a predetermined pattern, each measurement module having an IC chip for processing positional information and measured values to generate relevant signals, and a tester antenna for receiving and transmitting the signals from the IC chip, and upon receipt of frequency signals from the source antenna, generating induced power for driving the IC chip and transmitting the measured values for the frequency signals to the IC chip; and
   a measurement controller for receiving the signals from the tester antenna and processing the positional information and the measured values of the respective measurement modules.

2. The antenna measurement system of claim 1 wherein the tester body is shaped with a plane, a sphere, a semisphere, a hexahedron, or a hexahedron with no bottom side.

3. The antenna measurement system of claim 1 or 2 wherein the measurement modules are installed at the locations of the tester body determined during the process of manufacturing the tester body.

4. The antenna measurement system of claim 1 wherein the measurement module is made by mounting the IC chip and the tester antenna at a substrate shaped with a rectangle, a circle or an oval with a length or a maximum diameter of several micrometers.

5. The antenna measurement system of claim 1 or 4 wherein the tester antenna has wires spirally wound on two or more-leveled imagined planes, and the wires formed at the imagined plane neighbors are connected to each other at the central ends or peripheral ends thereof to form a single line.

6. The antenna measurement system of claim 5 wherein a feeder is connected to the peripheral end or the central end of the wire formed at the bottommost imagined plane.

7. The antenna measurement system of claim 5 wherein the wire formed at the imagined plane is shaped with a rectangle, a circle, an oval, a hexagon or an octagon while being spirally wound forward or backward.

8. The antenna measurement system of claim 5 wherein an insulating layer is formed between the wires to prevent the possible short-circuiting.

9. The antenna measurement system of claim 1 or 4 wherein the tester antenna is structured such that spiral wires are formed on the one-sided surfaces of dielectric thin films, through holes are formed at the respective dielectric thin films such that the through holes are alternately connected to the central end or the peripheral end of the relevant wire, the dielectric thin films are deposited while filling the through holes with a conductive material, and a feeder is formed at the bottom side of the bottommost dielectric thin film such that the feeder is connected to the through hole thereof.

10. A method of measuring the radiation characteristic of a source antenna, the method comprising the steps of:
   arranging a plurality of measurement modules at a tester body in a predetermined pattern, each module having an IC chip for processing positional information and measured values to generate signals, and a tester antenna for receiving and transmitting the signals from the IC chip, and upon receipt of frequency signals from the source antenna, generating induced power for driving the IC chip and transmitting the measured values for the frequency signals to the IC chip;
   placing the tester body apart from the source antenna with a predetermined distance such that the tester body is perpendicular to the central axis of the source antenna; and
   operating the source antenna, and operating the measurement controller such that the measurement controller receives and data-processes the positional information and the measured values from the tester antenna of each measurement module provided at the tester body.

11. A method of measuring the radiation characteristic of a source antenna, the method comprising the steps of:
   arranging a plurality of measurement modules at a tester body in a predetermined pattern, each module having an IC chip for processing positional information and measured values to generate signals, and a tester antenna for receiving and transmitting the signals from the IC chip, and upon receipt of frequency signals from the source antenna, generating induced power for driving the IC chip and transmitting the measured values for the frequency signals to the IC chip;
   placing the source antenna within the tester body such that the source antenna is positioned at the center of the tester body; and
   operating the source antenna, and operating the measurement controller such that the measurement controller receives and data-processes the positional information and the measured values from the tester antenna of each measurement module provided at the tester body.

12. The method of claim 11 wherein the tester body is shaped with a sphere, a semi-sphere, a hexahedron, or a hexahedron with no bottom side.

* * * * *